United States Patent [19]

Bok et al.

[11] 3,921,796

[45] Nov. 25, 1975

[54] METHOD OF CONVEYING ROUND WAFERS

[75] Inventors: Hendrik Frederik Bok, Fairhaven; Eugene Raymond St. Onge, E. Freetown, both of Mass.

[73] Assignee: In-Line Technology, Assonet, Mass.

[22] Filed: June 15, 1973

[21] Appl. No.: 370,516

[52] U.S. Cl. .................................. 198/266; 198/103

[51] Int. Cl.² ........................................... B65G 47/24

[58] Field of Search ........... 198/240, 241, 236, 237, 198/238, 266, 34, 103; 134/71–75, 124–126, 131, 151, 153, 134, 157; 354/329

[56] References Cited

UNITED STATES PATENTS

| | | | |
|---|---|---|---|
| 2,095,502 | 10/1937 | Johnston | 134/31 UX |
| 2,157,638 | 5/1939 | Soubier | 198/240 |
| 2,803,332 | 8/1957 | Hagerman | 198/240 |
| 3,827,582 | 8/1974 | Lederer | 198/34 |

*Primary Examiner*—Robert J. Spar
*Assistant Examiner*—James M. Slattery
*Attorney, Agent, or Firm*—David H. Semmes

[57] ABSTRACT

Method for conveying wafers, such as round silicone wafers for example through surface cleaning, developing, baking and etching processes. The method is characterized in the upright support of the wafers in alignment with the axis of conveying, while rotating the wafers during conveying. Treating liquid, such as developer, rinse and etch may be sprayed upon sides of the wafer during the rotating and advancing. The method is characterized in that the spraying and drain-off during rotating applies a consistent coating and treating.

2 Claims, 6 Drawing Figures

METHOD OF CONVEYING ROUND WAFERS

BACKGROUND OF THE INVENTION

1. Field of the invention

Transporting round silicone wafers through surface cleaning, developing, post-baking and etching processes.

In the process of manufacturing semi-conductor devices, the silicone wafers are submitted to the following process steps:

1. surface cleaning treatment of the wafers prior to the application of photo-resist, to assure pinhole-free coatings and maximum adhesion.
2. Developing of the exposed photo-resist images with or without attached post-baking.
3. Etching of the silicone wafer surface in reverse, upright or vertical position. As a result, there is a marked drainage imperfection at the lower end of the stationary wafer.

SUMMARY OF THE INVENTION

According to the present method of conveying, the wafers are supported in a vertical attitude such that their sides are aligned with the axis of conveyance. The wafers are rotated upon an axis transverse to the axis which defines the substantially vertical plane of the movement of conveying, such that the wafers are turned, as shown, around a plurality of individual axis which are in substantial perpendicular alignment with the axis or plane of conveying while they are being sprayed with treating solution. As a result, there are developed uniform drainage patterns of the treating liquid, such as developer or etching solutions. This avoids the conventional drain-off pattern which causes extremely poor line definition where over-developing, for example, will take place in the direction of the drain-off during the developer cycle or, in the case of etching it will cause poor etch definition with undercutting in a direction of the drain-off pattern. According to the present method, uniform developing and etching is provided so that extremely high density patterns with lines as small as one micron may be achieved.

DESCRIPTION OF THE PREFERRED EMBODIMENTS

Figure 1:
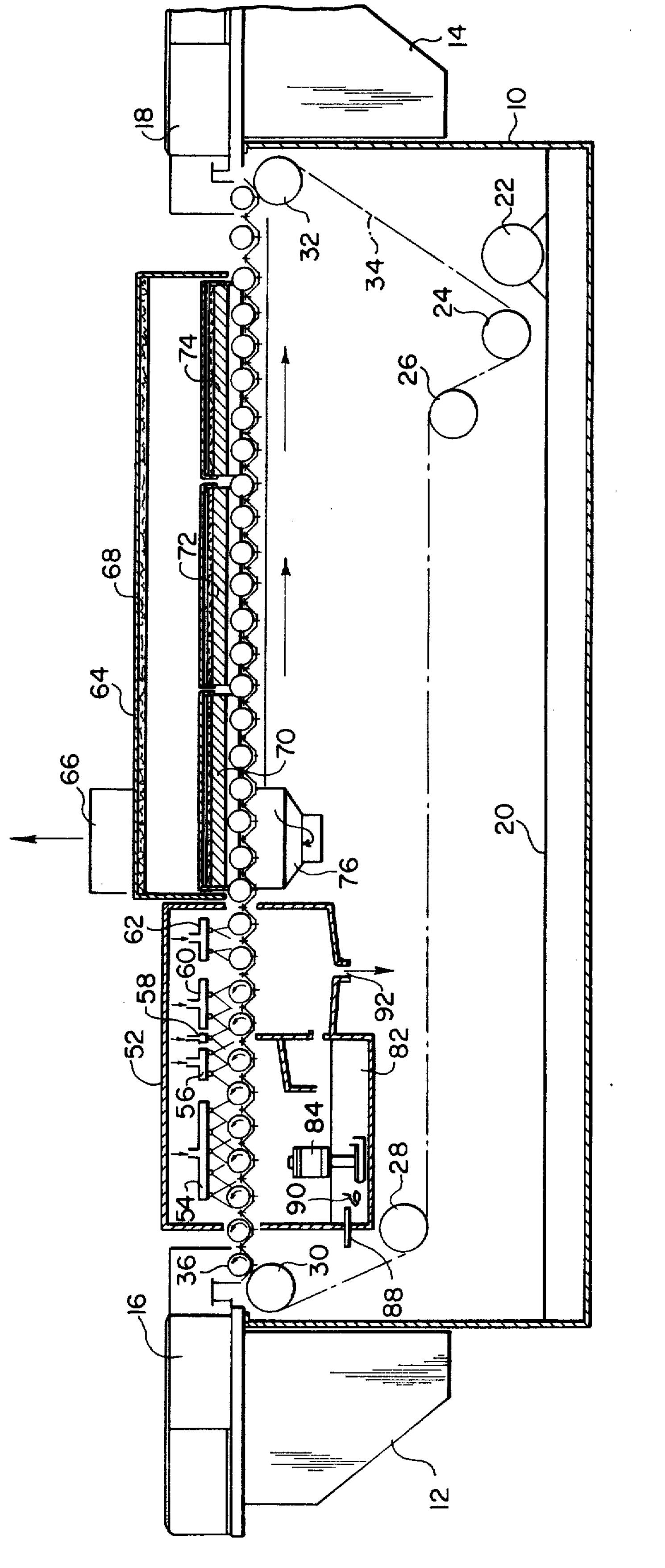
FIG. 1 is a schematic view of an automatic developing and post-baking system according to the present invention.

In FIG. 1 an automatic and post-baking system is illustrated schematically as comprising housing 10 to which are attached suitable brackets 12 and 14 for an explosion proof 8 cassette turret type wafer unloader 16 at the feeding end and an explosion proof 8 cassette turret type loader 18 at the discharge end. A drive motor 22 may be supported upon platform 20 so as to drive sprocket 24 engaging conveying sprocket chain 34 mounted upon idler rollers 26, 28, 30 and 32.

Figure 2:
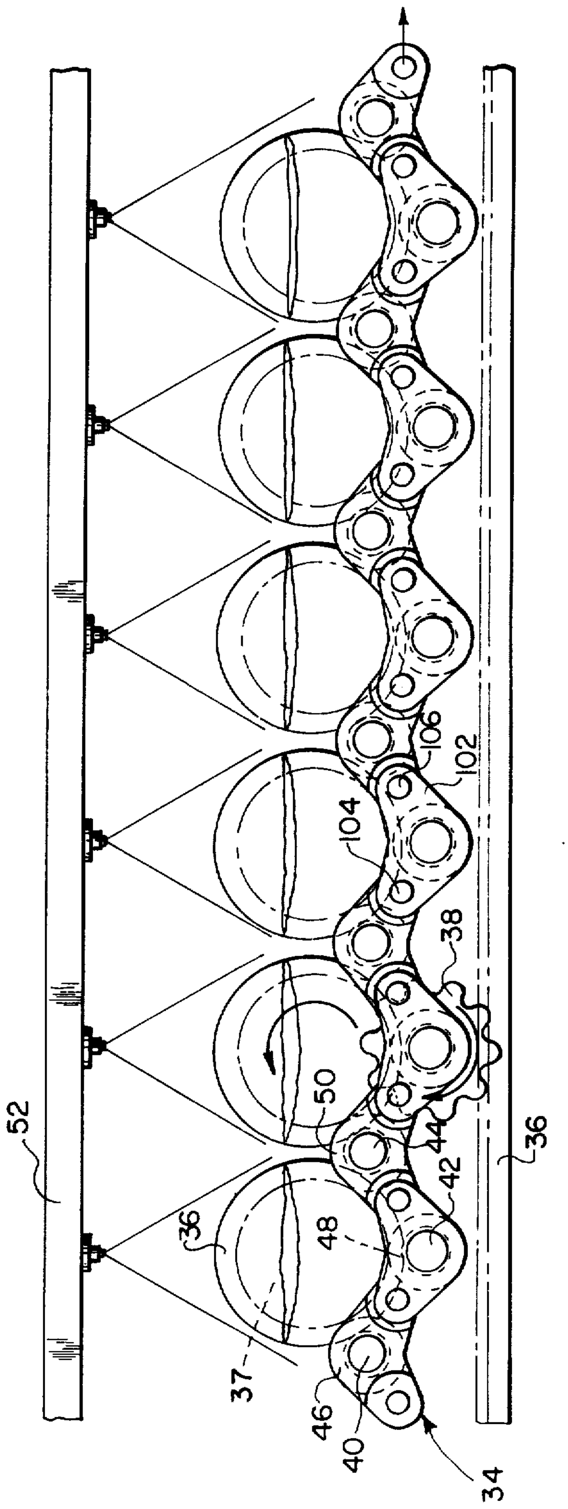
FIG. 2 is an enlarged, fragmentary side elevation of a proposed system for vertically supporting, while rotating and advancing the round silicone wafers through a spraying manifold.
Figure 3:
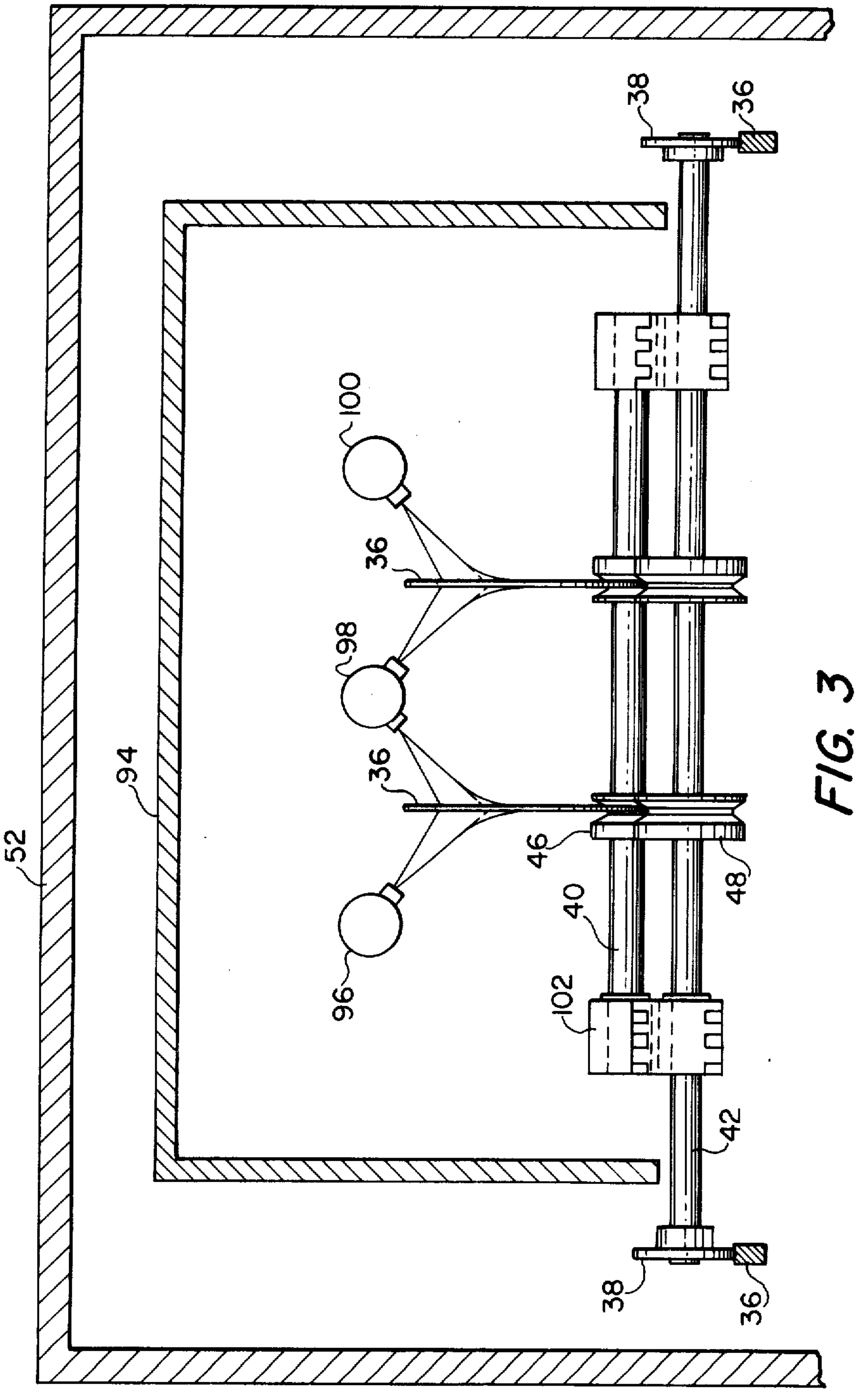
FIG. 3 is a transverse section of the liquid spraying manifold, showing vertical support of the round wafer during longitudinal advancing, while spraying from both sides and draining off from the bottom of the wafer.

As illustrated in FIG. 2, the chain 34 is comprised of individual links 102, secured to each other by means of pins 104 and 106. Chains 34 are mounted in tandem upon rear cross bar 40, forward cross bar 44 and roller shaft 42 which, as illustrated in FIG. 3, engages sprocket 38 at either end. The sprocket may be driven by suitable rack 36 such that the median roller 48 rotates at the speed of advance of the conveyor chain 34. Rear transverse shaft 40 has mounted thereon substrate roller 46 and forward transverse shaft may have mounted thereon substrate roller 50 engaging the periphery of the 3 inch diameter wafer 36 or, alternatively, the 2 inch diameter wafer 37, as illustrated in phantom in FIG. 2.

As will be apparent in FIG. 3, the wafer is thus aligned with the axis of conveying and is addressed transversely by liquid spraying nozzles 96, 98, 100. The uniform rotation of the wafer during advancing, assures uniform application of the treating of liquids, such as developer, wash, etching and the like.

The wafers thus supported may be advanced from the explosion proof unloader 16 into the developing station 52 comprised of circulating developer manifold 54, virgin developer manifold 56, thinner manifold 58, alcohol manifold 60 and nitrogen drying manifold 62.

In the post-baking sequence, the wafers are advanced through oven 64, provided with suitable insulation 68 and a series of infra-red heater panels 70, 72 and 74 and thence unto explosion proof 8 cassette turret type loader 18.

As many as four conveyor chains may be provided so as to convey and treat simultaneously four sets of wafers.

Oven 64 may be provided with exhaust manifold 76.

Developer sump 82 may be positioned beneath circulating and virgin developer manifolds 54 and 56 with a special baffle 86, so as to guide the virgin developer into the sump. A suitable circulation pump 84 may be provided, together with coil heater 90 and thermometer 88 controls. A similar alcohol and nitrogen recovery sump 92 may be provided for delivery to a storage tank.

Figure 5:
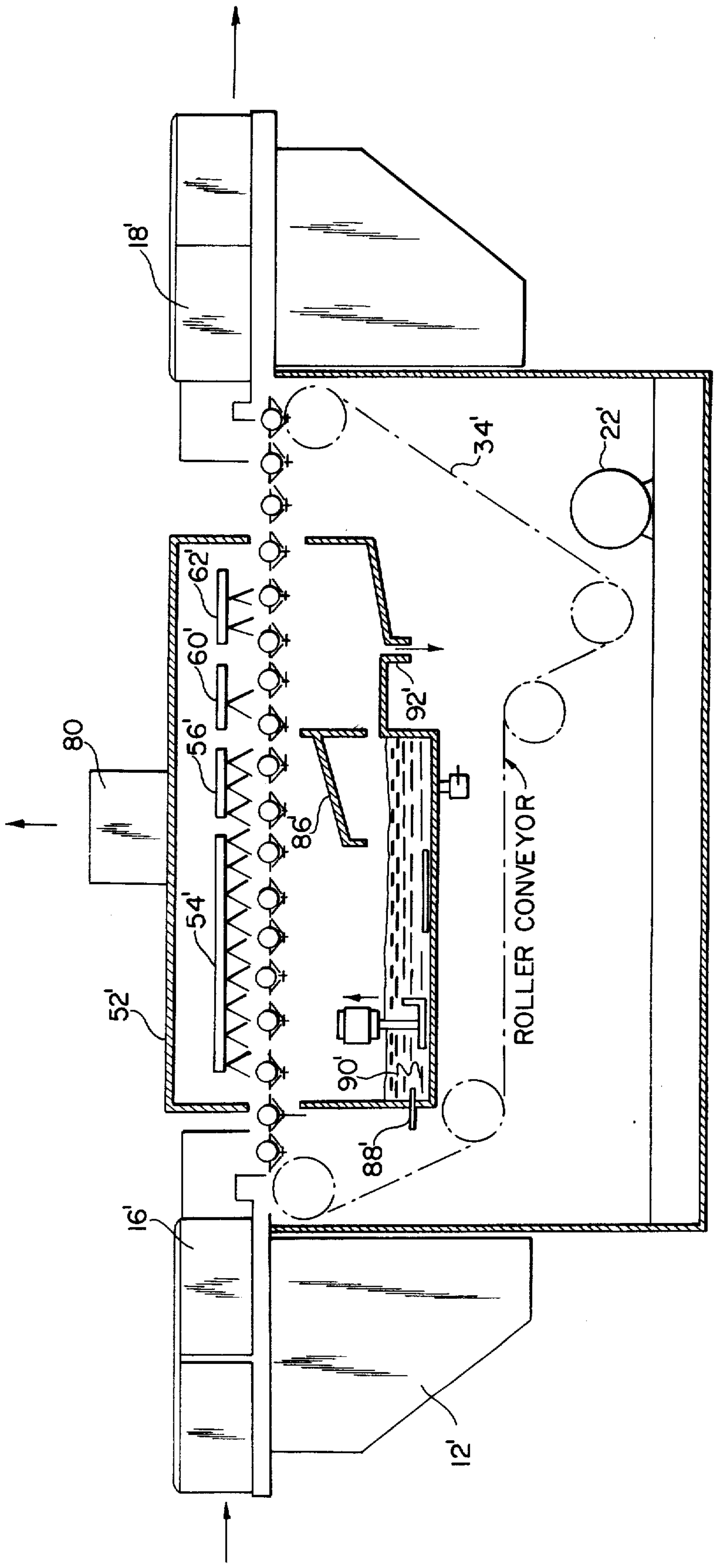
FIG. 5 is a schematic view of a simple automatic developing system without post-baking.

In FIG. 5 there is illustrated a modified circulating and developing housing 52' and wherein the post-baking sequence has been eliminated. As will be apparent conveying chain 34', suitably driven by motor 22' may convey the wafers through circulating developer manifold 54', virgin developer manifold 56', alcohol manifold' 60' and nitrogen manifold' 62'. An exhaust manifold 80 may also be provided.

Figure 4:
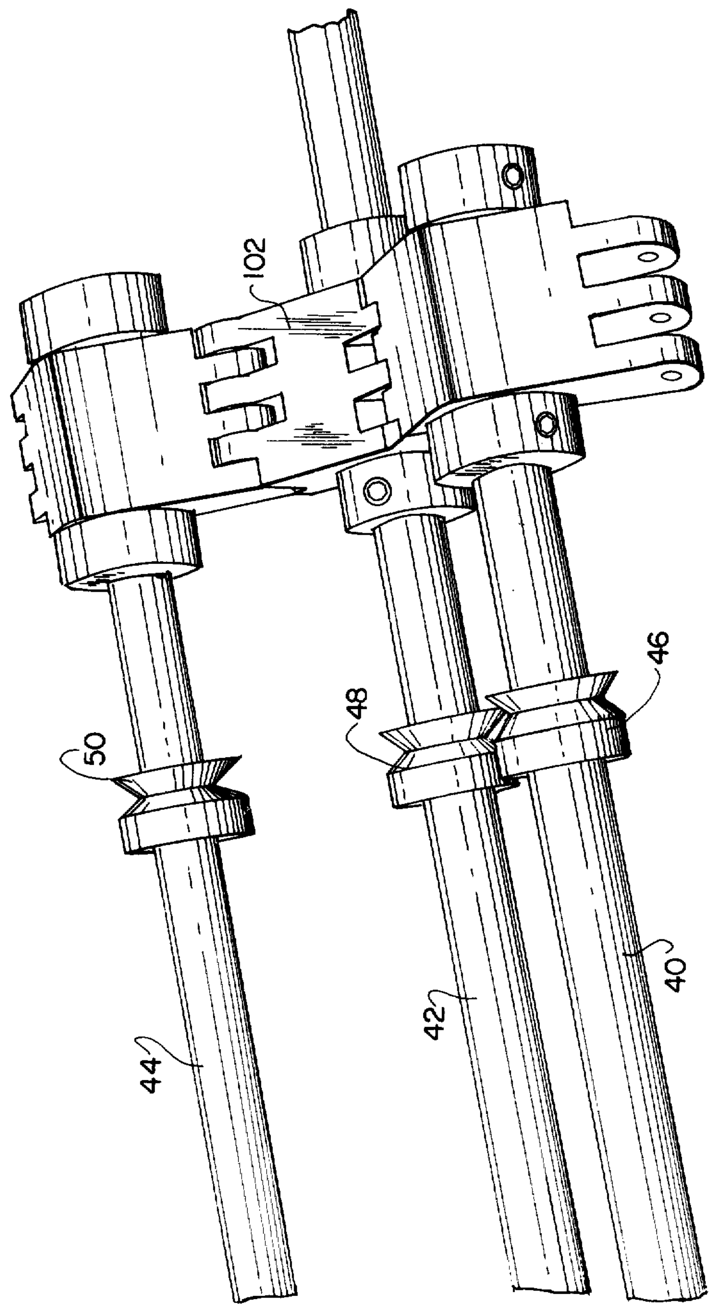
FIG. 4 is a fragmentary perspective of a suggested device, embodying three rotating rods, each with substrate rollers practised according to the present method so as to vertically support, rotate and advance the wafers.
Figure 6:
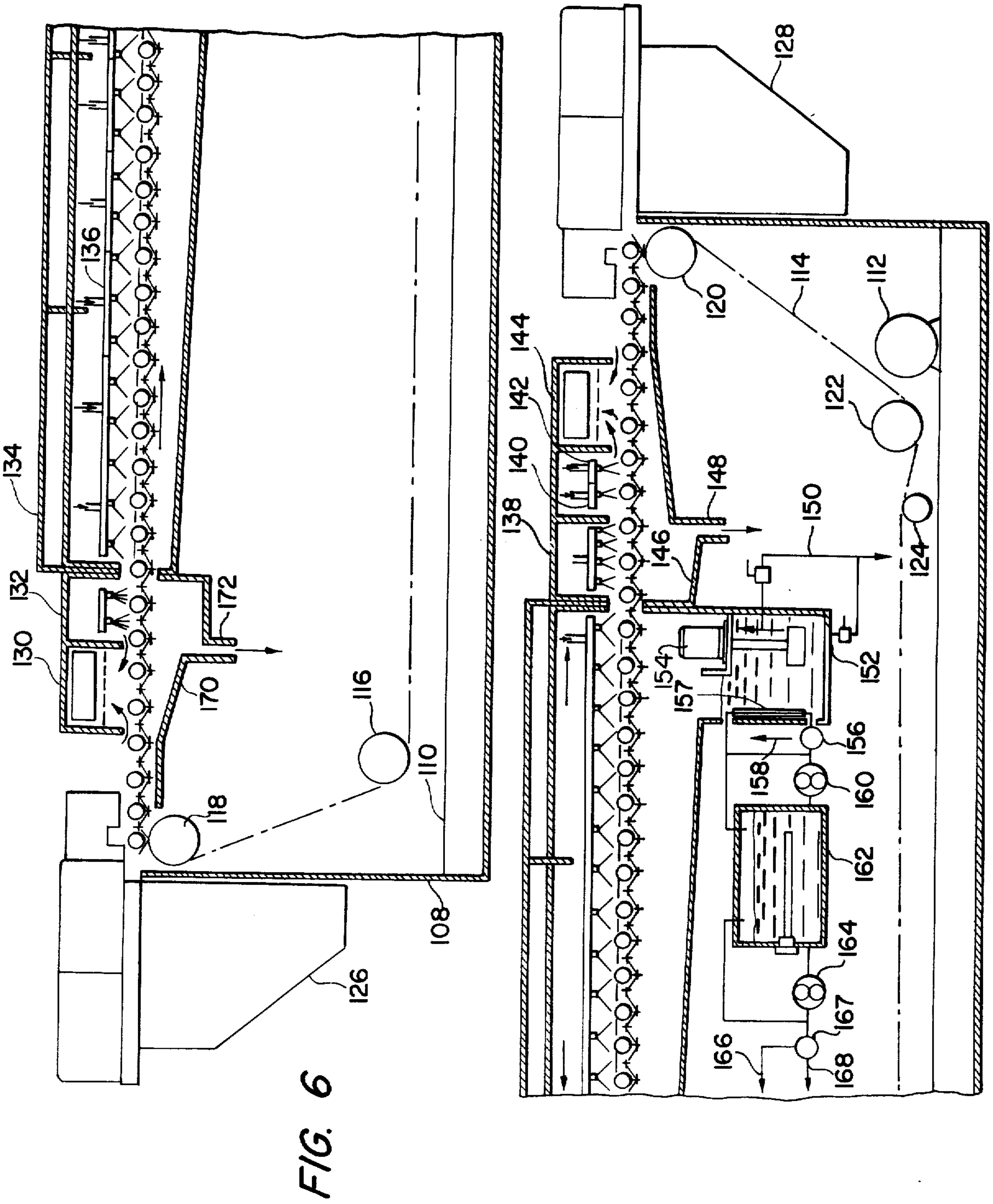
FIG. 6 is a schematic view of a etching and drying system.

In FIG. 6 there is illustrated an etching and drying system including housing 108 with interior shelf 110 upon which drive motor 112 may be mounted and coupled to drive gear 122 engaging conveyor chain 114 mounted upon tensioning roller 124 and idler rollers 116, 118, 120 and 122. Suitable turret cassette unloader 126 may be positioned at the feeding end and a suitable cassette unloader 128 may be positioned at the discharge end. The wafers are thus positioned upon the chain links of the type illustrated in FIGS. 2–4 so as to be advanced through spray etch housing 134, having a spray manifold 136, thence unto water rinse manifold 138, and drying manifold including nitrogen manifold 140, alcohol rinse 142, thence through final exhaust manifold 144 and into the pick-up 128.

A suitable baffle 146 may be provided to direct the rinsing water. Similarly an acid sump 52 with pump 154 and drain system 150 may be provided. A heat exchanger 157 may be positioned with suitable temperature control 158, valve 156. A heated water sump 162 may be controlled by pump 160 and 164 with suitable valving element 166 and regulated by temperature control 166 and heating external acid sump 168 (not illustrated). In the spray rinse housing 130 a suitable baffle 170 and water drain 172 may also be provided.

In a preferred installation the automatic developing and post-baking housing illustrated in FIG. 1 was 12 ft. long × 30 inches wide. The design output was based upon a conveyor speed of 2 ft. per min. with a 70 seconds developing cycle, followed by a 10 second cycle such that approximately 600 2 inch diameter or 3 inch diameter wafers per hour per single track could be treated. A system provided with two tracks, as illustrated in FIG. 3, could thus provide a total output of 1,200 wafers per hour.

The general frame of the housing was constructed of 1 inches × 1½ inches × ⅛ inches cold roll steel tubing, coated with primer and polyurethyne paint for maximum solvent resistance. The basic enclosure of the developing, alcohol rinsing, drain and sump tank components was made of polyprophylene with heat welded joints. The conveyor materials, including pumps and heaters were constructed of materials of suitable use in conjunction with solvents. The transparent covers 52 and 94 were fabricated of clear polypropylene. The housing components could be comprised of removable steel panels, primed and coated with textured polyurethyne paint.

In addition, a complete set of safety locks would be provided to turn the developer pump off in any of the following conditions:

1. partial or complete exhaust system failure, resulting in an inadequate exhaust air flow;
2. opening of the transparent covers;
3. inadequate level of developer in the sump tank for the submersable pump.

Design specifications include:

CONVEYOR SYSTEM

This developer system will be furnished with a unique rotating rod-type conveyor which will provide a three-point support to hold the wafer in a vertical position, rotate the wafer, and transport the wafer through the entire system.

Each wafer support rod is provided with grooves to hold and rotate 2 inch diameter wafers and grooves to hold and rotate 3 inch diameter wafers. No changes in the conveyor system are required. However, the unloading and loading air bearing tracks have to be exchanged when changing over from a 2 inch -diameter wafer to a 3 inch diameter wafer.

LOAD STATION

The unit will be provided with a 12-inch-long loading station, which is accessible from both the front and the side of the unit. The turret-type cassette wafer unloader bolts onto the front end of the unit. The load station can be extended to allow manual loading of wafers with a size other than those being automatically processed (i.e., when auto loader is set up for 3 inch wafers, 2 inch wafers may be processed if they are manually loaded).

EXHAUST PLENUMS

An exhaust plenum will be provided at both the load and exit ends of the developer system to prevent vapors from entering the work area.

DEVELOPER STATION

This system will be provided with a 32 inches long developer station, consisting of four spray manifolds. The first 24 inches long spray manifolds spray the circulating developer solution for 60 seconds onto both sides of the wafer. The second 8 inches long, double manifolds spray the virgin developer solution to complete the developer cycle.

The production wafer developing system provides the following functions:

1. automatically feeds wafers from the eight-cassette turret-type unloader via an indexing and transfer mechanism onto air bearing tracks.
2. transfer of wafers onto the automated developing and post-bake system. Wafers will be placed in a vertical position onto the roller track conveyor and will rotate during the actual spray developing, alcohol rinse and nigrogen dry functions.
3. spray development of both sides of the wafer. The first developing section utilizes a recirculating developer solution for approximately 50 seconds, during which time 98 percent of the unexposed resist has been removed. Immediately after the recirculating-type developer spray, the wafers are spray rinsed with virgin developer for 10 seconds. The developer is supplied from a pressure pot or tank and flows into the circulating developer tank to replace the exhausted developer solution.
4. Spray rinse both sides of the wafer with "thinner" for 10 seconds.
5. Spray rinse both sides of the wafer with clean alcohol for approximately 20 seconds.
6. Dry both sides of the wafers with room temperature or heated nitrogen.
7. Automatically pick up wafers from the roller conveyor and transfer the wafers back into the cassettes, located in the eight cassette turret loader.

This automated developing system can process up to 1,200 2 inch diameter wafers per hour, utilizing two tracks. (System will accomodate wafers up to 3 inch diameter.) The developer-post bake module can be used as an individual system, or can be interfaced with the etcher and wet or dry process stripping modules to form one continuous process line.

The developer section is provided with a 5-gallon solvent and tank and explosion-proof sump pump. The temperature of the developer solution will be maintained, within the sump, at 85°F ± 5°F. A stainless steel heating/cooling coil, in the sump tank, will be heated with plant-supplied hot water or, when required, cooled, using plant-supplied cold water. Temperature within the sump will be sensed by a thermocouple-type temperature controller and regulated by time proportioning.

The virgin developer spray section is provided with a drain which allows the used virgin developer to flow into the circulation developer sump tank.

The circulation sump tank is provided with an overflow. The developer overflow, the "thinner" drain and the alcohol drain are piped into a storage sump tank for storage of the used solutions. The sump tank and storage tank area are exhausted.

Subsequent to the developing cycle, the wafers are sprayed with a "thinner" solution for ten seconds. Thinner will be supplied from a pressurized, five-gallon storage tank. An alcohol spray rinse completes the wet process cycle, followed by a nitrogen blow-off.

UNLOAD STATION

The unit will be provided with a twelve-inch-long unloading station which is accessible from both the front and the side of the unit. The turret-type wafer loader bolts onto the unload end of the unit.

In the etching and drying system illustrated in FIG. 6 specifics include:

CAPACITY

Design output based on a conveyor speed at 1 foot per minute and a 10-minute maximum etching cycle is approximately 300 2 inch diameter wafers per hour per single track. System will be provided with two tracks, allowing a total output of 600 wafers per hour. (Systems can be provided with up to four tracks to increase output to 1,200 wafers per hour.)

CONVEYOR SYSTEM

This etcher will be furnished with a unique rotating rod-type conveyor which will provide a three-point support to hold the wafer in a vertical position, rotate the wafer, and transport the wafer through the entire system.

Each wafer support rod is provided with grooves to hold and rotate 2 inch diameter wafers and grooves to hold and rotate 3 inch diameter wafers. No changes in the conveyor system are required to process either 2 inch or 3 inch wafers. However, the unloading and the loading air bearing tracks have to be exchanged when switched from a 2 inch diameter wafer to a 3 inch diameter wafer.

LOAD STATION

The unit will be provided with a 12 inch long loading station, which is accessible from both the front and the side of the unit.

EXHAUST PLENUMS

A transparent polypropylene exhaust plenum will be provided at both the imput and the exit ends of the system, to prevent acid vapors from entering the work area.

SPRAY RINSE STATION NO 1

Prior to entering the etching chamber, the wafers pass through a water spray rinse station which will rinse away any dust particles which may be present on the wafers, and most important, the fogging action of the nozzles will wash the acid mist laden air being drawn out of the etch chamber on its way to the exhaust plenum. Demisting units will be provided in the exhaust duct to remove the dilute acid mist.

ETCH STATION

This system will be provided with a 12-ft. long etch chamber, which would be manifolded to spray etch the wafers from both sides. Twenty-four separate manifolds are provided (one manifold for every 6 inches of conveyor travel to allow flexibility of the etch time without changing the conveyor speed.

The etch chamber will be provided with a 5-gallon acid sump tank, which will be heated by an immersible teflon heat exchanger system consisting of a series of small teflon tubes through which heated water, from a separate heated tank, would be circulated by a small pump.

The temperature of the etchant will be sensed by a teflon-clad thermistor device located in the spray pattern of the auxiliary nozzle. The output signal of the thermistor will be fed into an ultra-sensitive thermoregulator, which will control the etchant temperature by requlating the flow of heated water through the teflon heat exchanger. The indicating type thermoregulator sensitivity may be varied from 1.01°C to 0.5°C (supplied preset at 0.1°C sensitivity). Absolute accuracy is ±1 percent of scale range (59°–212°F).

The hot water sump tank, which is built into the etcher, will be supplied with an integral heater and temperature controller. This sump tank will also be provided with two separate circulation pumps (one pump for each heat exchanger).

A heated fifteen-gallon storage tank will also be supplied with the etcher, to provide heated, ready-to-use etchant at the simple turn of a valve. Temperature of the storage tank will be controlled by the same type thermoregulator used in the etcher. The acid in the storage tank will also be heated by a teflon heat exchanger. The storage tank may be installed adjacent to or remote from the etcher system.

SPRAY RINSE STATION NO 2.

After completion of the etch cycle, the wafers will proceed through the final water rinse station to neutralize and remove the etchant. (System can be furnished with integral, stainless steel, D.I. water heater.)

OPTIONAL DRYING STATION

A drying station can be included within the system if desired. This dryer would provide a three-step drying cycle:

1. Remove excess water with nitrogen blow-off.
2. Spray wafers (both sides) with alcohol which is recirculated from a built-in sump.
3. Remove last traces of alcohol with a heated nitrogen blow-off.

UNLOAD STATION

The unit will be provided with a 12-inch long unload station, which is accessible from both the front and the side of the unit. The turret-type cassette wafer loader bolts directly onto the unload end of the system.

In addition to the foregoing, similar cut-off controls may be employed as in the developing system and, also, the unit may be controlled to cut-off when there is inadequate water supply for either of the water rinse stations or there is excessive temperature in the acid sump tank, the water sump tank or the acid storage tank. An audible alarm system could be triggered simultaneously.

Manifestly, the developing and rinsing components, as well as the chain conveying system structure may be varied without departing from the spirit of the invention.

We claim:

1. Method of conveying wafers of the type comprising thin discs having two circular and parallel sides comprising the steps of:

A. supporting each of said wafers in a vertical attitude and conveying said wafers within a vertical plane, such that each of said circular and parallel sides are aligned parallel to said plane of conveying; and B. rotating each of said wafers upon an axis which is transverse to and perpendicular to said plane of conveying, such that each of said wafers is turned while being conveyed and maintained in said alignment with said plane of conveying, while C. advancing said wafers through a longitudinal sector wherein said steps of supporting, rotating and advancing further comprise supporting and advancing each of said wafers at three points contacting a lower segment of said circular peripheries of said rotating wafers and rotating each of said wafers through contact with the middle of said three points.

2. Method of conveying wafers as in claim 1, wherein said advancing is by longitudinal movement of said rotating elements through said longitudinal sector.

* * * * *